United States Patent [19]

Hauzer et al.

[11] Patent Number: 5,160,595
[45] Date of Patent: Nov. 3, 1992

[54] ARC-MAGNETRON AND THE METHOD OF COATING

[75] Inventors: Fransiscus J. M. Hauzer, Velden; Wolf-Dieter Münz, Venlo; Boudewijn J. A. M. Buil, Belfeld, all of Netherlands; Dietmar Schulze, Dresden, Fed. Rep. of Germany; Roel Tietema, Venlo, Netherlands

[73] Assignee: Hauzer Holding B.V., Venlo, Netherlands

[21] Appl. No.: 701,388

[22] Filed: May 16, 1991

[30] Foreign Application Priority Data

Apr. 19, 1987 [EP] European Pat. Off. ........ 91106331.1
May 28, 1990 [DE] Fed. Rep. of Germany ....... 4017111

[51] Int. Cl.$^5$ .................................................. C23C 14/34
[52] U.S. Cl. ...................... 204/192.38; 204/192.12; 204/298.2; 204/298.41; 427/580
[58] Field of Search ............ 204/298.16, 298.17, 204/298.19, 298.2, 298.22, 298.41, 192.12, 192.38; 427/37

[56] References Cited

U.S. PATENT DOCUMENTS

| | | | |
|---|---|---|---|
| 3,836,451 | 9/1974 | Snaper | 204/298.41 |
| 4,309,266 | 1/1982 | Nakamura et al. | 204/298.2 |
| 4,559,125 | 12/1985 | Mularie | 204/298.41 |
| 4,724,058 | 2/1988 | Morrison, Jr. | 204/298.41 X |
| 4,734,183 | 3/1988 | Wirz et al. | 204/298 |
| 4,927,513 | 5/1990 | Schultheiss et al. | 204/298.2 |
| 5,022,978 | 6/1991 | Hensel et al. | 204/298.19 |

Primary Examiner—Nam Nguyen
Attorney, Agent, or Firm—Townsend and Townsend

[57] ABSTRACT

An arc magnetron is described in which an edge magnet arrangement is displaceable in the axial direction relative to a preferably fixedly mounted center pole permanent magnet so that a cathode sputtering process and/or an arc discharge process can be realized in dependence on the relative position of the edge magnet arrangement and the center pole magnet.

16 Claims, 3 Drawing Sheets

ARC-MAGNETRON AND THE METHOD OF COATING

BACKGROUND OF THE INVENTION

The invention relates to an apparatus for the coating of substrates using an arc discharge process and a cathode sputtering process, the apparatus comprising an evacuatable vessel in which are arranged at least one target, an associated anode and also a substrate carrier, wherein associated current and voltage supplies are provided and wherein a magnet arrangement is associated with each target.

In the non prior published German patent application P 39 41 918.5 there is described a method of coating substrates in which the layer to be applied is produced by condensing particles of a plasma generated by means of a gas discharge which impinge on the relevant substrate. Characteristic for this process is the fact that both an arc discharge vaporisation process and also a cathode sputtering process are effected, with the arc discharge vaporisation being carried out prior to the cathode sputtering process.

During the arc discharge vaporisation process the substrate is first bombarded with ions of such an optimized high energy and ion current density that the substrate surface is cleaned by ion etching and partly removed. Furthermore, during this arc discharge vaporisation process, an anchoring of the layer which is to be built-up is preferably brought about in the substrate material, and coating by means of the cathode or magnetron sputtering process then takes place directly after the formation of the anchoring.

SUMMARY OF THE INVENTION

The object of the invention is to provide an apparatus which in particular makes it possible to realize the above described method in a particularly economical manner, that is to say while minimizing the cost and complexity of the technical apparatus.

This object is satisfied essentially in that the magnet arrangement comprising a center pole permanent magnet and oppositely poled permanent edge magnets surrounding and spaced from the center pole permanent magnet is displaceably mounted relative to the associated target in such a way that, in a first position adjacent the target, a magnetic field is generated in the target region which makes a cathode sputtering process possible, and in such a way that, in a second position spaced relative to the target, a magnetic field is generated which makes an arc discharge process possible.

In this manner it is possible to generate in the target area, or in the area of the target surface during the phase of the arc discharge, a magnetic field with a magnetic field component extending parallel to the target surface in the range from 10 to 250 Oe, in particular 10 to 50 Oe, while in the phase of the cathode sputtering the corresponding component has values in the range from 50 to 500 Oe, in particular 100 to 250 Oe.

The spacing of the magnet arrangement from the target lies in the phase of arc discharge operation in the range from 10 to 20 cm.

In accordance with one layout of the invention the target can be surrounded by an electromagnetic ring coil. This electromagnetic coil is in particular in operation during the phase of the cathode sputtering process, can however also be used in the phase of the arc discharge process in order to influence the arc track which forms on the target, and in this way to increase the servicable life of the target.

The apparatus of the invention is particularly advantageously used for the manufacture of nitrides, carbonitrides and also carbides of titanium, zirkonium, hafnium, tantalum, niobium, aluminum and their binary and ternary mixtures.

Particularly advantageous forms of the invention are set forth in the subordinate claims.

BRIEF DESCRIPTION OF THE FIGURES

The invention will explained in more detail in the following with reference to the drawing in which are shown.

DETAILED DESCRIPTION OF THE PREFERRED EMBODIMENT

Figure 1:
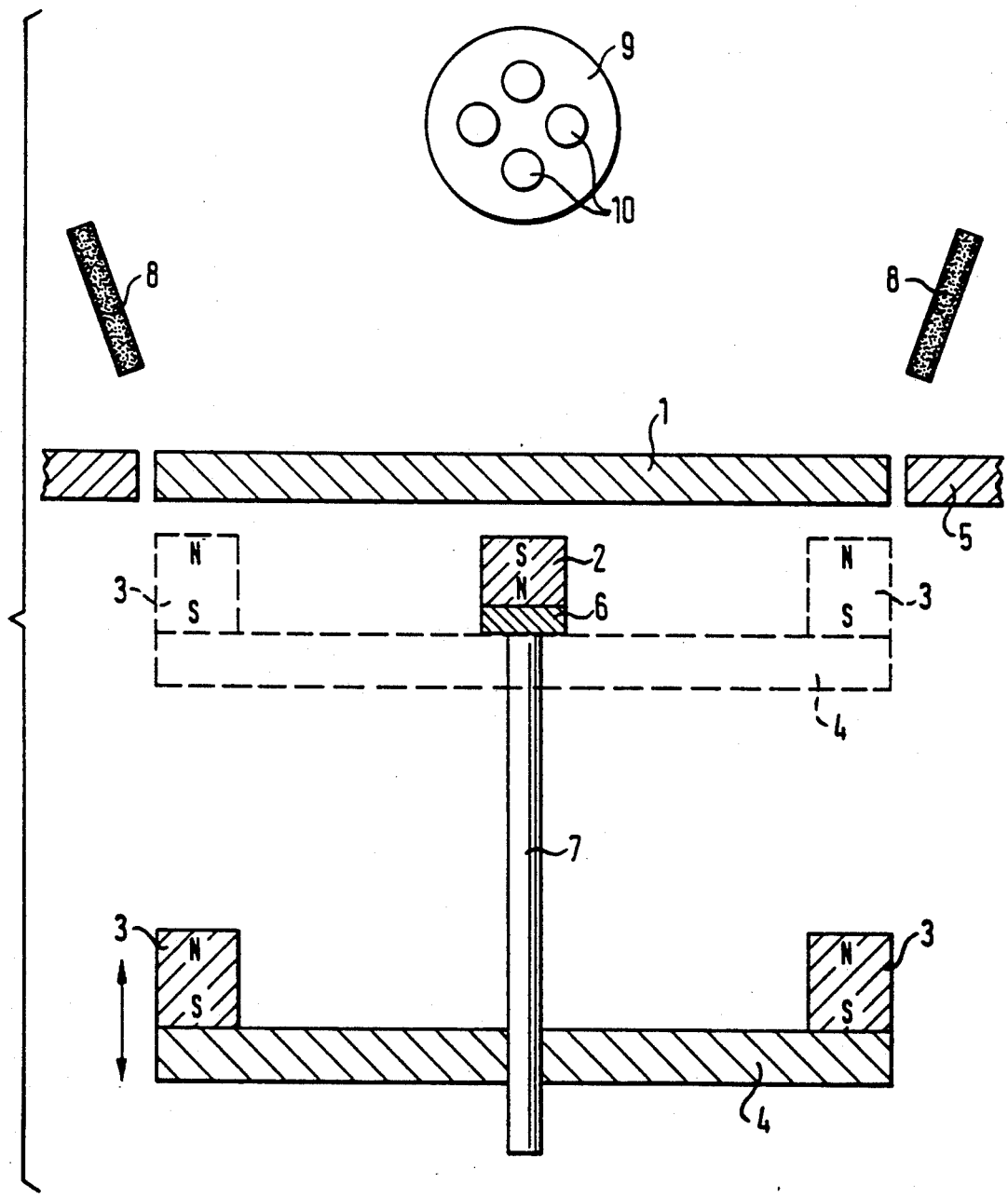
FIG. 1 a schematic illustration of a first embodiment of an apparatus in accordance with the invention, FIG. 2 a likewise schematic illustration of a second embodiment of the invention, and FIG. 3 a schematic plan view of the target with the associated power supplies.

FIG. 1 shows a first example of an arc magnetron in accordance with the invention. In this arrangement a center pole permanent magnet 2 is arranged directly adjacent a target 1 and is mounted or secured on a rod-like carrier 7 of magnetically neutral material via the intermediary of a distance element or spacer 6 which is likewise of magnetically neutral material, for example of copper or aluminium. Through this center pole permanent magnet 2, which in accordance with this embodiment is of fixed location and only has a small spacing relative to the target 1, a magnetic field is generated in the target area which permits the operation of the apparatus in the arc discharge mode within the evacuated vessel or chamber 5.

In the vessel or chamber 5 a substrate carrier 9 is located alongside a schematically illustrated anode 8 required for the arc discharge. This anode may be a ring anode and is conveniently formed by part of the chamber 5. Substrate carrier 9 can be displaceably or rotatably formed and serves to hold the substrates 10 to be coated.

In addition to the center pole permanent magnet 2, permanent edge magnets 3 are provided at a radial spacing from the center pole permanent magnet 2 and are magnetically short circuited via a carrier plate 4. In comparison to the center pole permanent magnet 2, the permanent edge magnets 3 are oppositely poled relative to the target 1.

This edge arrangement of permanent magnets can be moved in the axial direction in accordance with the illustrated double arrow, for which purpose the carrier plate 4 has a central opening through which the carrier rod 7 for the center pole permanent magnet 2 extends, so that a relative movement is possible between the center pole permanent magnet 2 and the permanent edge magnets 3.

The arrangement 2, 4 of the permanent magnets at the edge is brought during arc discharge into the inactive position shown in continuous lines. During the phase of cathode sputtering the arrangement of permanent magnets at the edge adopts the position shown in broken lines adjacent the target 1 and cooperates with the center pole permanent magnet 2 to form a pronounced tunnel-like magnetic field in the region of the target surface.

As the center pole permanent magnet 2 is separated by the spacer 6 from the arrangement 3 of permanent magnets at the edge an advantageously inbalanced, extremely effective magnetron arrangement arises which leads to a favourable uniform erosion profile.

Figure 2:
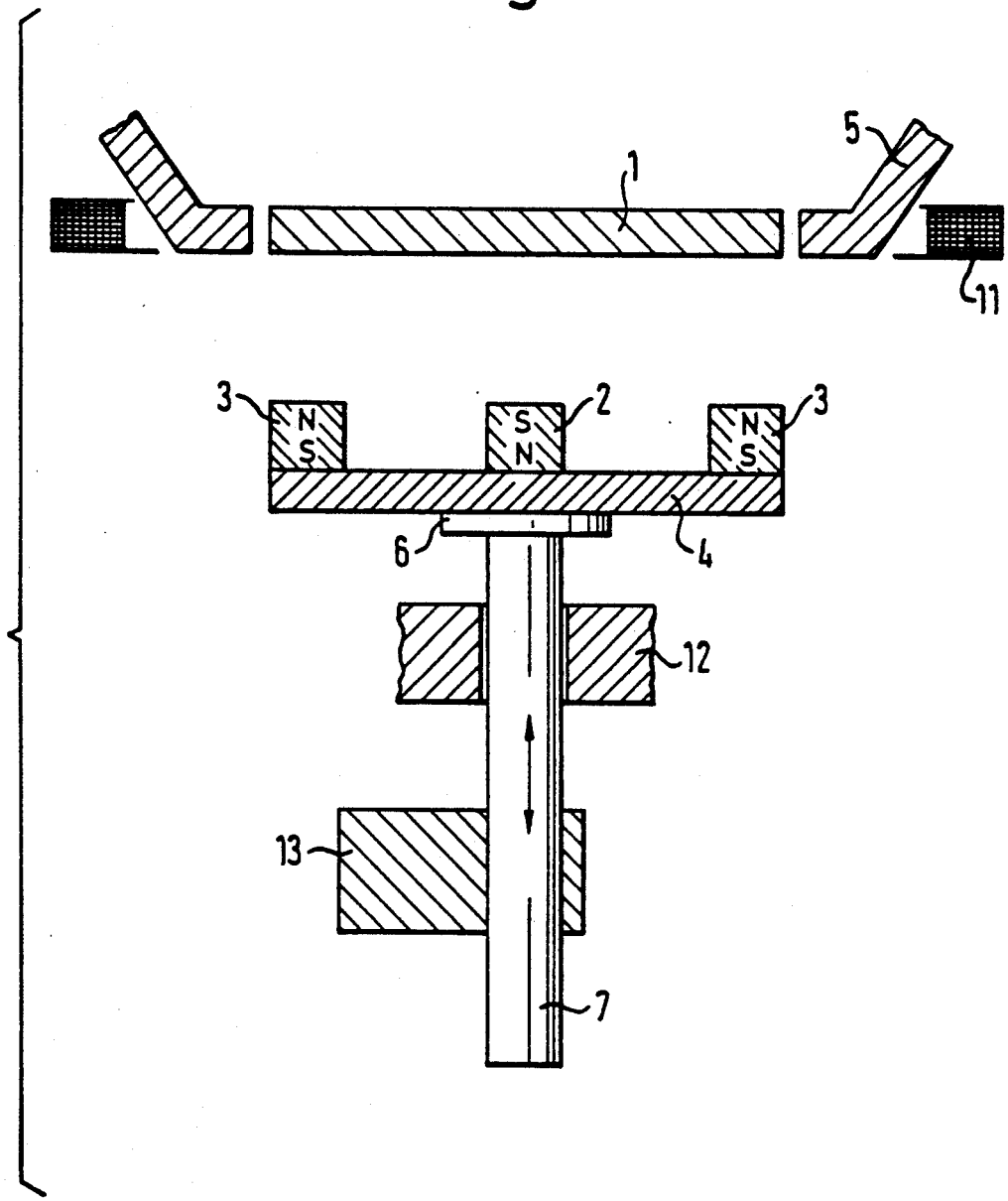

The variant shown in FIG. 2 has in contrast to the embodiment of FIG. 1 the advantage of greater simplicity without the effectiveness of the permanent magnet arrangement being disturbingly impaired during arc discharge or cathode sputtering operation.

In this embodiment the center pole permanent magnet 2 is axially movable together with the permanent edge magnets 3, so that the center pole permanent magnet 2 and the permanent edge magnets 3 can be arranged on the same carrier plate 4 which brings about the magnetic short circuit. The axial movement of this magnetic arrangement again takes place via a carrier rod 7 which is mounted in a schematic guide 12 and is axially movable via a drive unit 13.

An electromagnetic ring coil 11 is provided in the region of the target 1 and is set in operation in known manner during the cathode sputtering process, while during the phase of arc discharge it can however be set out of operation or so controlled that it influences the arc track which forms and thus contributes to increasing the service life of the target 1.

In the position shown in FIG. 2, in which the permanent magnet arrangement has a comparatively large spacing relative to the target 1, the scattering field which forms in the target area is sufficient in order to ensure the operation of the apparatus in the arc discharge mode. If the permanent magnet arrangement is moved axially upwardly and brought into the direct vicinity of the target 1 then the cathode sputtering process can be carried out.

Figure 3:
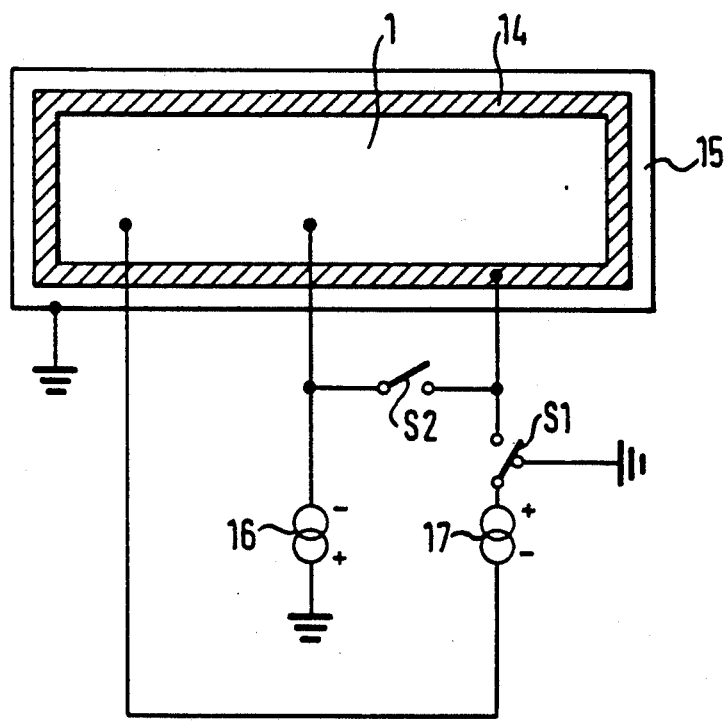

FIG. 3 shows a schematic plan view of a target 1 which is provided with a boron nitride boundary ring 14 which is mounted in insulated manner relative to the target and also with a plasma shield 15 which is connected to earth.

A magnetron supply 16 lies with its positive pole connected to earth and with its negative pole connected to the target 1, while an arc supply 17 lies with its negative pole on the target 1 and with its positive pole capable of being switched over by a switch S1 between earth and the boron nitride boundary ring 14. During the ignition process the positive pole is connected via the switch S1 to the boronnitride boundary ring 14 and, after ignition has taken place, the switch S1 is changed over so that the positive pole of the arc discharge supply 17 is connected to earth during normal operation.

During the transition from arc operation to magnetron operation the boron nitride boundary ring 14 can be connected via a switch S2 to the cathode potential or target potential to prevent arc discharges in the gap between the boundary ring 14 and the target 1. The switch S2 thus enables a potential separation of the boron nitride boundary ring.

Preferred values or value ranges of parameters of the apparatus of the invention will now be set forth for the arc discharge operating mode and for the cathode sputtering operating mode.

Operating mode arc discharge:
$P_{total}$: 0.5–50. $10^{-3}$ mbar, in particular $<10^{-3}$ mbar
$\Delta p_{Ar}$: 0.5–50. $10^{-3}$ mbar, in particular about $10^{-3}$ mbar
$\Delta p_{N2}$: 0.2–20. $10^{-3}$ mbar, in particular about $10^{-3}$ mbar
$\Delta p_{CxHx}$: 0.2–20. $10^{-3}$ mbar, in particular about $10^{-3}$ mbar
$I_{cathode}$: 35–200 A, in particular 40–60 A
$-U_{cathode}$: 50–120 V, in particular 60–90 V
$-U_{bias}$: 0–200 V, in particular 50–100 V
$H//$ : 10–250 Oe, in particular 10–50 Oe
spacing magnet arrangement/Target: 2–20 cm, in particular 10–20 cm Operating mode cathode sputtering:
$p_{total}$: 0.5–50. $10^{-3}$ mbar, in particular 2–5.$10^{-3}$ mbar
$\Delta p_{Ar}$: 0.5–50. $10^{-3}$ mbar, in particular 1–3.$10^{-3}$ mbar
$\Delta p_{N2}$: 0.2–20. $10^{-3}$ mbar, in particular 0.5–1.$10^{-3}$ mbar
$\Delta p_{CxHx}$: 0.2≈20. $10^{-3}$ mbar, in particular 0.2–1.$10^{-3}$ mbar
$U_{cathode}$: 300–750 V, in particular 400–600 V
$-U_{bias}$: 20–200 V, in particular 50–100 V
$N_{cathode}/F$: 5–25 W/cm$^2$, in particular 8–12 W/cm$^2$
$j_{bias}$: 0.5–10 mA/cm$^2$, in particular 2–5 mA/cm$^2$
$H//$: 0–500 Oe, in particular 100–250 Oe With these parameters $p_{total}$ will be understood to mean the sum of all partial pressures in the evacuatable vessel and the parameter $H//$ designates the size of the field component parallel to the target surface.

The parameter N designates the power density at the cathode, and the current density at the substrate is designated by $j_{bias}$.

The quoted parameter values also make it possible to select the spacings between the target and the magnet arrangement with regard to obtaining an optimum and to dimension the magnet arrangement itself with regard to obtaining the best possible result.

We claim:

1. An apparatus for coating a substrate by subjecting the substrate to an arc discharge to treat the substrate and by subjecting the substrate to a cathode sputtering process to apply the coating to the substrate, the apparatus comprising
    an evacuatable chamber the chamber including at least one target, and an anode;
    first means for subjecting the substrate to an arc discharge process;
    second means for subjecting the substrate to a cathode sputtering process;
    a magnet arrangement for each target comprising a center pole permanent magnet and oppositely poled permanent edge magnets laterally spaced from the center pole permanent magnet; and
    means for changing the position of the magnet arrangement for each target relative to the target so that, in a first position of the magnet arrangement adjacent the target, a magnetic field is generated in the target region which enables the second means to make the cathode sputtering process possible and, in a second position of the magnet arrangement remote from the target, a magnetic field is generated which enables the first means to make the arc discharge process possible.

2. Apparatus in accordance with claim 1, characterized in that the center pole permanent magnet and the permanent edge magnets are mounted on a common carrier plate which brings about a magnetic short circuit of the individual permanent magnets; and in that the carrier plate is coupled to an axially adjustable carrier rod.

3. The apparatus of claim 2, wherein the axially adjustable carrier rod is coupled to the carrier plate through a spacer element of magnetically neutral material.

4. Apparatus in accordance with claim 1, characterized in that the center pole permanent magnet is mounted relative to the target in a fixed position adjacent the target, and in that the permanent edge magnets, together with the carrier plate, are axially displaceably mounted relative to the target and to the center pole permanent magnet and wherein the means for changing move the permanent edge magnets between the first position and the second position.

5. Apparatus in accordance with claim 4, characterized in that the center pole permanent magnet and the permanent edge magnets are magnetically separated from one another, and including a spacer element of magnetically neutral material arranged between the carrier plate and the center pole permanent magnet.

6. Apparatus in accordance with claim 1, characterized in that the center pole permanent magnet is substantially smaller and magnetically less effective than the permanent edge magnets.

7. Apparatus in accordance with claim 1, including an electromagnetic coil surrounding the target and adapted to be controlled in dependence on which of the first and second means is operating.

8. Apparatus in accordance with claim 1, wherein the first and second positions are spaced apart in the range from about 10 to 20 cm.

9. Apparatus in accordance with claim 1, wherein the magnetic field generated by the magnet arrangement in the second position has a second component which extends substantially parallel to the target surface during arc discharge, and wherein the magnetic strength of the second component lies in the range from about 10 to 250 Oe.

10. The apparatus of claim 9, wherein the magnetic strength of the second component is in the range from 10 to 50 Oe.

11. Apparatus in accordance with claim 1, wherein the magnetic field generated by the magnet arrangement in the first position has a first component which extends substantially parallel to the target surface during cathode sputtering, and wherein the magnetic strength of the first component is in the range from about 50 to 500 Oe.

12. The apparatus of claim 11, wherein the magnetic strength of the first component is in the range from 100 to 250 Oe.

13. Apparatus in accordance with claim 1, characterized in that the target surface is surrounded by a boron nitride boundary ring insulated relative to the target; and in that this boron nitride boundary ring is electrically coupled to a cathode when the arc discharge process is selected.

14. Apparatus in accordance with claim 1, characterized in that the anode is formed by the vessel or structure built into said vessel.

15. A method for coating a substrate comprising the steps of
   placing the substrate adjacent to a target material;
   applying a magnetic field of a first intensity to the target material;
   performing an arc discharge vaporization process on the substrate;
   immediately thereafter applying a magnetic field of a second intensity to the target material subsequent to the performing of the arc discharge vaporization step; and
   performing a cathode sputtering process on the substrate immediately after completion of the step of applying a magnetic field of a second intensity.

16. Apparatus for coating a substrate by first subjecting it to an arc discharge treatment and immediately thereafter coating the substrate by subjecting it to a cathode sputtering process, the apparatus comprising:
   an evacuatable chamber including a target, an anode and a cathode in the chamber;
   a permanent magnet arrangement for the target comprising a center pole permanent magnet and permanent edge magnets, oppositely poled to the center pole magnet and laterally spaced therefrom;
   means for changing the position of the magnet arrangement relative to the target so that in a first position of the magnet arrangement a magnetic field generated thereby acting on the target is of a first, relatively higher strength selected so that an arc discharge process can take place, and in a second position of the magnet arrangement the magnetic field is of a strength so that a cathode sputtering process can take place;
   first means operatively coupled with the position changing means for subjecting the substrate in the chamber to an arc discharge process for treating the substrate; and
   second means for subjecting the same substrate while still in the chamber to a cathode sputtering process to thereby coat the substrate.

* * * * *